United States Patent [19]

Kantner

[11] Patent Number: 5,627,416
[45] Date of Patent: May 6, 1997

[54] MULTI-VOLTAGE IC CARD HOST

[75] Inventor: Edward A. Kantner, Raleigh, N.C.

[73] Assignee: ITT Corporation, New York, N.Y.

[21] Appl. No.: 505,609

[22] Filed: Jul. 21, 1995

[51] Int. Cl.$^6$ .................................................. H01H 35/00
[52] U.S. Cl. ........................ 307/119; 395/283; 439/188; 439/439
[58] Field of Search ........................... 439/377, 188, 439/488, 489, 785, 787, 439, 680, 681; 395/282, 283; 307/119

[56] References Cited

U.S. PATENT DOCUMENTS

| | | |
|---|---|---|
| 4,699,443 | 10/1987 | Goodrich et al. |
| 4,726,775 | 2/1988 | Owen . |
| 4,804,336 | 2/1989 | Miller . |
| 4,869,672 | 9/1989 | Andrews Jr. |
| 4,900,273 | 2/1990 | Pernet . |
| 5,013,255 | 5/1991 | Juret . |
| 5,033,972 | 7/1991 | Komatsu . |
| 5,061,190 | 10/1991 | Medeiros . |
| 5,196,994 | 3/1993 | Tanuma . |
| 5,277,591 | 1/1994 | Felcman . |
| 5,330,363 | 7/1994 | Gardner . |
| 5,334,034 | 8/1994 | Reichardt . |
| 5,370,544 | 12/1994 | Reichardt . |
| 5,421,734 | 6/1995 | MacWilliams ........................ 439/59 |
| 5,490,117 | 2/1996 | Oda et al. ........................ 365/226 |

*Primary Examiner*—David S. Martin
*Assistant Examiner*—Kim Lockett
*Attorney, Agent, or Firm*—Thomas L. Peterson

[57] ABSTRACT

An electronic device has a host with a card-receiving slot, and can receive and operate with both low voltage (3 volts) and high voltage (5 volts) IC (integrated circuit) cards. The inner end of the slot has a voltage-discriminating first side, and has a switch (82, FIG. 5) with an actuator (80) lying at a location that is occupied by a discrimination key portion (69) that is present in a low voltage card but not a high voltage card. The electronic device has both lower and higher voltage circuits (124, 130) for energizing lower and higher voltage cards, and the type of card sensed by the switch determines which circuit is connected to contacts at the inner end of the slot.

7 Claims, 5 Drawing Sheets

FIG. 6
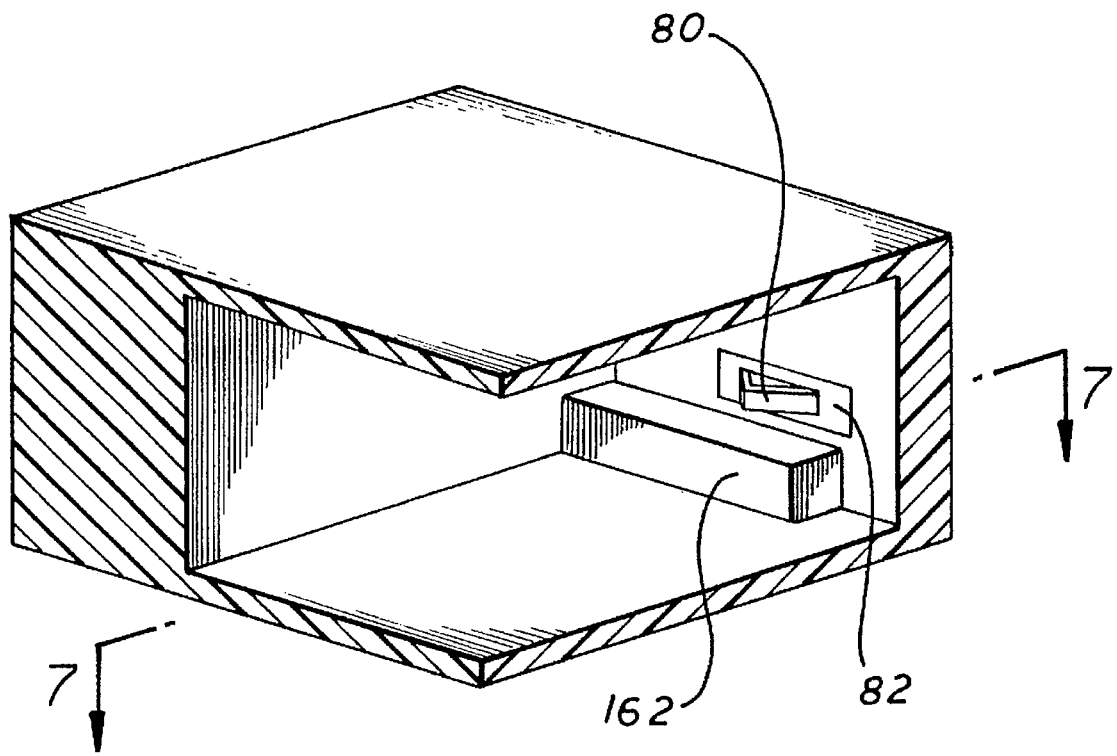
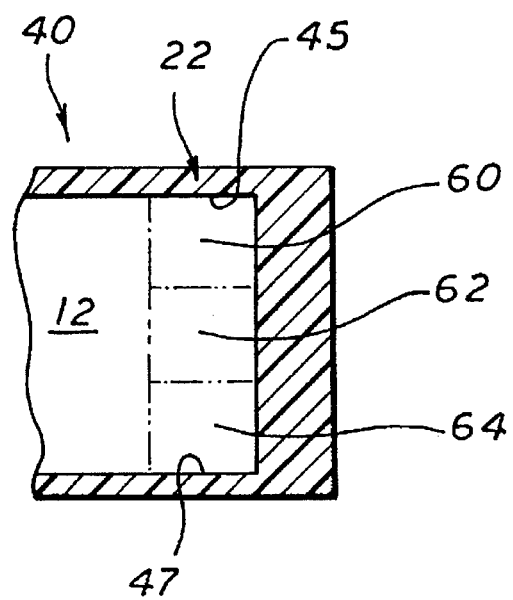
FIG. 8

MULTI-VOLTAGE IC CARD HOST

BACKGROUND OF THE INVENTION

IC (integrated circuit) cards, which are all about the same width and length as a typical credit card, are designed for insertion into a slot of a card-receiving host which may lie in an electronic device such as a notebook computer. The PCMCIA (Personal Computer Memory Card International Association) currently specifies two logic voltages that are in general use, these being nominally three volts and five volts. Five volt cards require energization at about five volts and are designed to receive and generate digital signals of about five volts. Many newer electronic devices are able to use three volts in their logic circuits, which saves battery power, and are designed to operate with corresponding three volt IC cards.

At present, different host connectors, or hosts, are required for cards of different logic voltages. A high-voltage host will fully receive only a high-voltage card. A low voltage host will receive both high and low voltage cards, but the high voltage card will not operate when fully inserted. Low voltage cards cannot be inserted into high voltage hosts, because low voltage cards have a card discriminating key portion which will abut a barrier region in a high voltage host. It would be desirable if an electronic device and a single card host therein could fully receive and properly operate both high and low voltage cards.

SUMMARY OF THE INVENTION

In accordance with one embodiment of the present invention, an IC card-receiving host and an electronic device that holds such host, are provided, which enables circuitry in the electronic device to effectively interact with either a high voltage or low voltage IC card that is inserted into the slot of the host. The slot in the host has an inner end with at least one laterally-extending row of contacts and with first and second opposite sides. The first side of the host slot has top, bottom, and middle regions, with the middle region devoid of a barrier that is otherwise present in prior high voltage hosts to keep out low voltage cards. Instead, a switch is provided with an actuator lying at the middle region, to sense that an inserted card is a low voltage card.

The electronic device has low and high voltage circuits that can each energize and/or interact with different voltage logic signals. When the switch or sensor senses a low voltage card, it connects the low voltage circuit to the pin contacts that lie at the inner end of the host slot. When the switch senses a high voltage card, as when a switch actuator is not operated at a time when a card is fully inserted, the high voltage circuit is connected to the pin contacts at the inner end of the slot.

The novel features of the invention are set forth with particularity in the appended claims. The invention will be best understood from the following description when read in conjunction with the accompanying drawings.

BRIEF DESCRIPTION OF THE DRAWINGS

FIG. 6 is a sectional isometric view of a portion of the host of FIG. 5, but without showing the pin contacts.

FIG. 8 is a view of a portion of the host of FIG. 5, with different regions indicated in phantom lines.

DESCRIPTION OF THE PREFERRED EMBODIMENT

Figure 1:
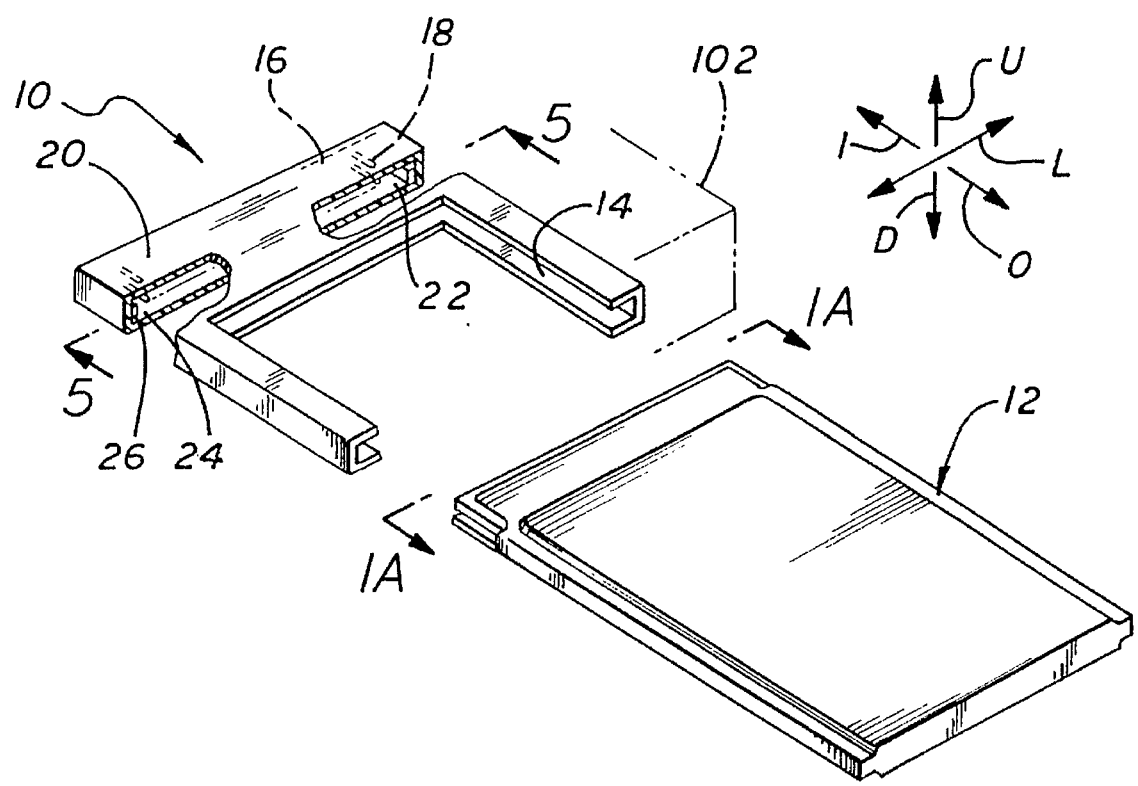
FIG. 1 is a partially section, exploded isometric view of a card-receiving host and an IC card.

FIG. 1 illustrates a card-receiving host 10 of the present invention, which is designed to receive a data card or IC (integrated circuit) card 12. The host has a card-receiving slot 14 that can receive a card inserted in an inward direction I (which is opposite to an outward direction O) until the card lies in a fully inserted position. The slot has an inner end 16, and has two rows of pin-type contacts 18 projecting outwardly from the slot inner end, for mating with card socket-type contacts 19. Each row of pin contacts in the host slot extends in a lateral direction L. The slot has an inner portion 20 with first and second laterally-spaced opposite sides 22, 24. The second side has an orientation key barrier 26 which assures that the card is inserted in a proper orientation (not upside-down) into the slot. The first side 22 is constructed to sense whether the IC card 12 is a high voltage (e.g. nominally 5 volts) card which has a high logic voltage, or a low voltage (e.g. nominally 3 volts) card which has a low logic voltage.

Figure 2:
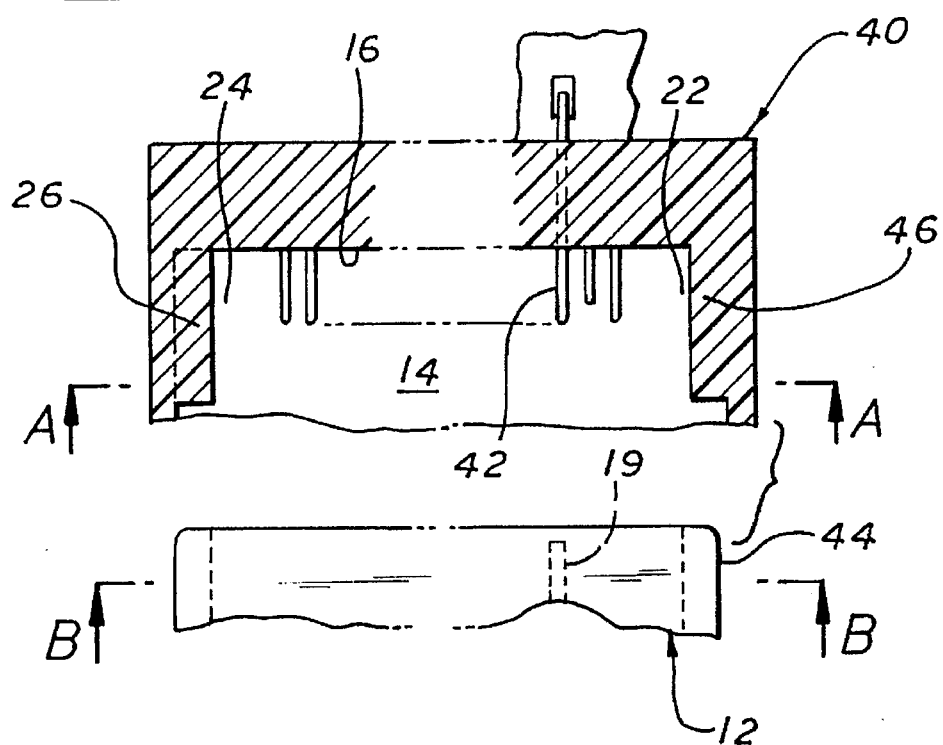
FIG. 2 is a partial sectional exploded view of a prior art host and card.
Figure 1A:
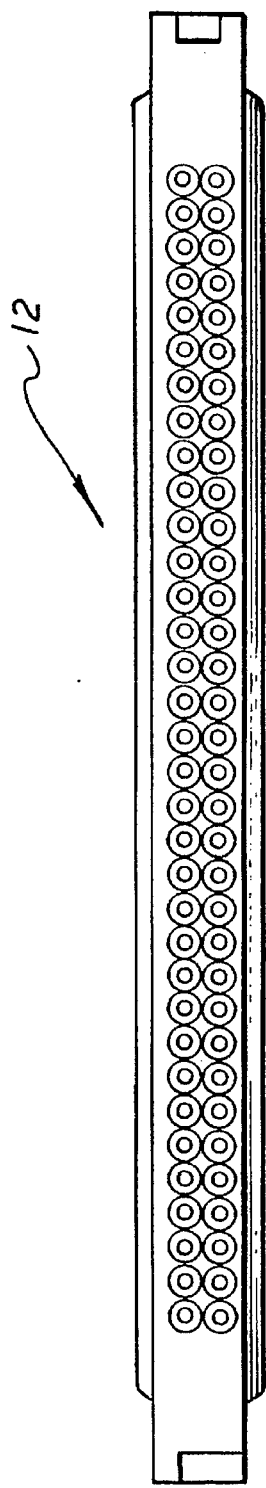
FIG. 1A is a view taken on line 1A—1A of FIG. 1.

FIG. 2 illustrates a portion of a prior art host 40, and of a present and prior art IC card 12 which can be inserted into the slot so pin contacts 42 of the host 40 can mate with socket contacts 19 in the card. Before the pin and socket contacts can mate, a forward end portion 44 of the card must pass across barriers 26, 46 lying at the opposite sides of the host slot 14. As shown in FIG. 8, which is taken on line A—A of FIG. 2, the first side 22 of the host slot 14 has a top and bottom 45, 47 and three regions therebetween. The three regions include an upper region 60, a lower region 64, and a middle region 62. Each region occupies about a third of the slot height. The presence or absence of a barrier at the middle region 62 of the host slot, determines whether or not a low voltage card can be fully inserted into the host.

Figure 3:
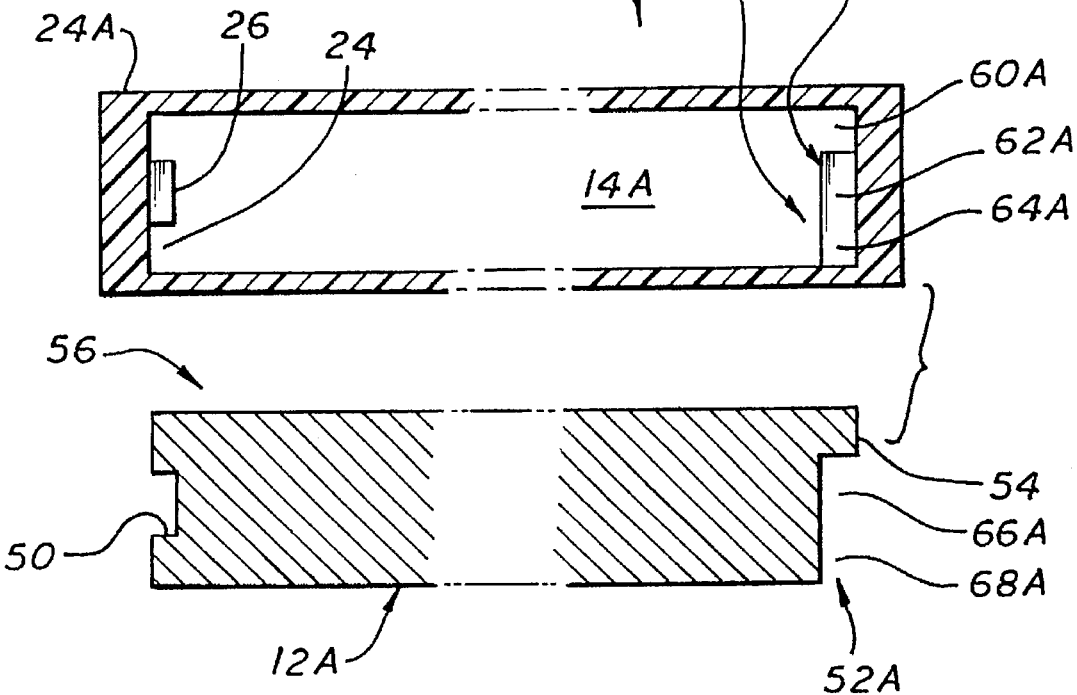
FIG. 3 is an exploded sectional view of the host and card of FIG. 2, for the case of a prior art five volt host and card, with a view of the host taken on line A—A of FIG. 2 and a view of the card taken on line B—B of FIG. 2.

FIG. 3 illustrates a prior art host and card 40A, 12A which are designed to operate at a high voltage (5 volt). The high voltage card 12A, is shown in the cross section taken on line B—B of FIG. 2. The card 12A has an orientation groove 50 at a second side thereof, which is designed to receive the orientation key barrier 26 at the second side 24A of the host. The card 12A has a first side 52A which is designed to enter the first side 22A of the host. The first side 22A of the host has a top region 60A, a bottom region 64A, and a middle region 62A. The top region 60A, which is empty, is designed to receive a card lateral positioning portion 54 which forms a key at the first side of the card. It is noted that the card lateral positioning portion 54 assures that the opposite second side 56 of the card will lie closely at the second side 24 of the slot. The lower region 64A of the host slot forms a barrier and is used merely to assure that the card is not installed upside-down in the slot. The middle region 62A also forms a barrier, and is designed to prevent the full insertion of a low voltage (3 volts) card fully into the high voltage slot 14A. The high voltage card has a card middle or discriminating location 66A which is empty, so the discriminating location 66A does not engage the host middle region 62A when inserted into the host slot. The card has a card lower region 68A which is empty.

Figure 4:
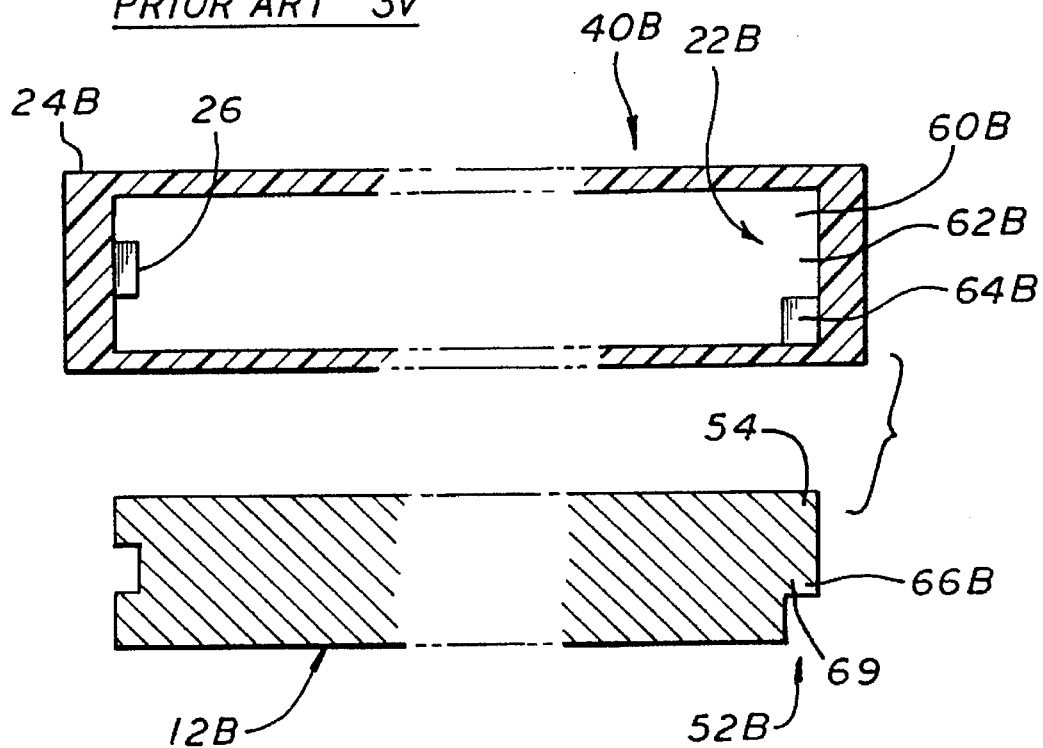
FIG. 4 is an exploded sectional view of the host and card of FIG. 2, for the case of a prior art three volt host and card, with a view of the host taken on line A—A of FIG. 2, and with a view of the card taken on the line of B—B of FIG. 2.

FIG. 4 illustrates a prior art host and card 40B, 12B which are designed to operate at a low voltage (3 volts). The second side 24 of the host slot is the same as for the high voltage host. However, the first side 22B differs, in that it does not contain a barrier at the host middle region 62B. The upper region 60B is also empty as in the case of the high voltage host. The first side 52B of the low voltage card 12B has a lateral positioning portion 54 that is identical to that of the high voltage card. However, the low voltage card has a card discriminating location 66B which is occupied by a discrimination key portion 69. The key portion 69 prevents the low voltage card 12B of FIG. 4 from being fully inserted into the high voltage host 40A of FIG. 3, since the key portion 69 would abut the host discriminating key barrier at region 62A.

It is possible to insert the high voltage card 12A of FIG. 3 into the low voltage host 40B of FIG. 4, although the card will not "work". That is, if the high voltage card is inserted into the low voltage host, the low voltage (3 volts) applied to energize the card circuitry, will not be sufficient and the high voltage card will not operate properly. As discussed above, it is not possible to insert the low voltage card 12B into the high voltage host 40A, because of the presence of the card discriminating key portion 69 of the low voltage card 12B. Such card key portion is provided because the circuitry of the low voltage card could be damaged by the high voltage.

In the prior art, each host was either a high voltage host of the type 40A of FIG. 3 or a low voltage host of the; type 40B of FIG. 4. If an electronic device should have sufficient circuitry to operate with either high voltage or low voltage cards, then in order to do so such electronic device would require two separate hosts (one for high voltage cards and one for low voltage cards). The present invention permits an electronic device with appropriate circuitry, to interact with either a high voltage or a low voltage card, using a single host and single host slot. Of course, the electronic device may have a plurality of hosts, but in that case, each host may be capable of operating with either a high voltage or low voltage card.

Figure 5:
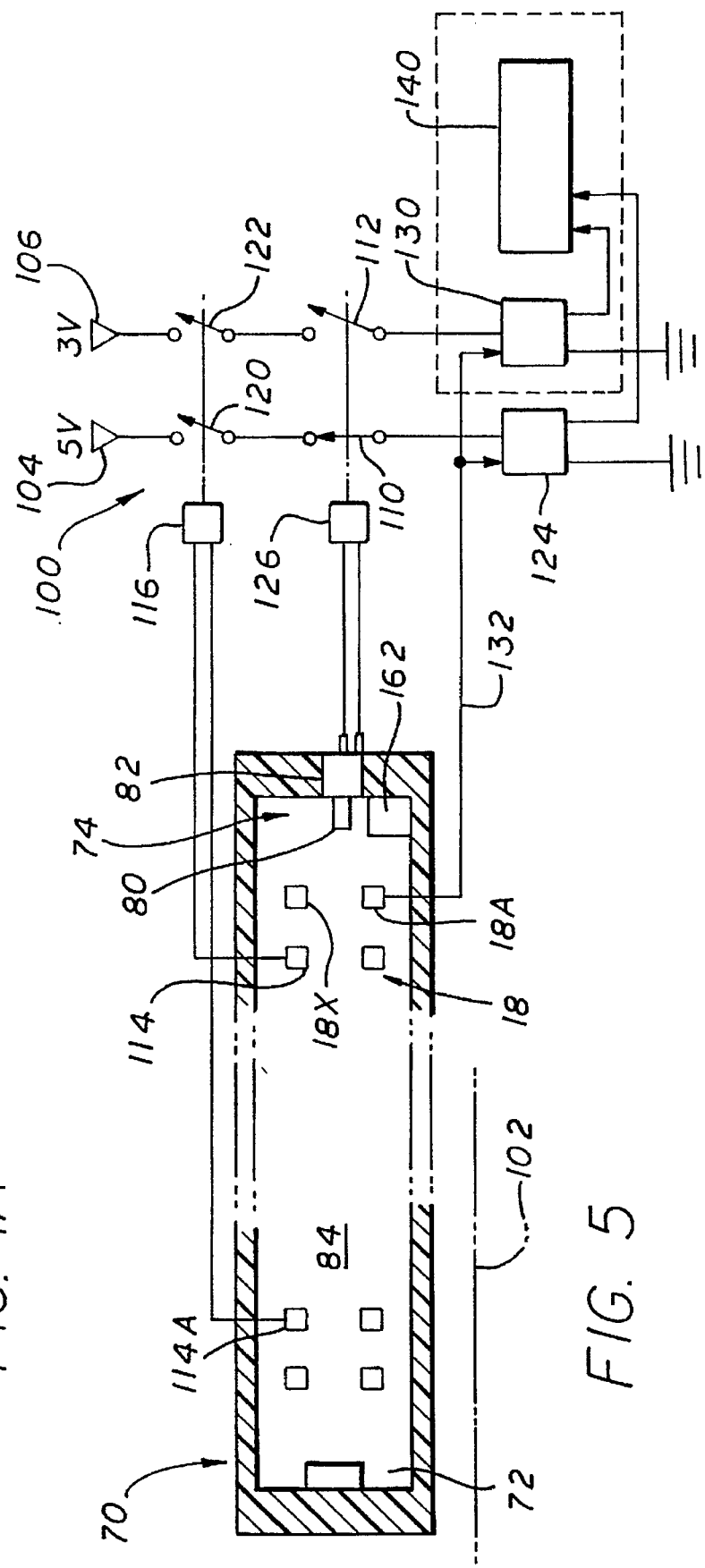
FIG. 5 is a sectional view of the host of FIG. 1 taken on line 5—5, and also showing circuitry of the electronic device.

FIG. 5 illustrates a host 70 of the present invention, which has a second side 72 similar to that of hosts of the prior art, but which has a modified first side 74. The first side 74 is similar to the first side 22B of the low voltage host of FIG. 4, except that it contains an actuator 80 of a switch 82. The slot 84 in the host 70 can fully receive either high voltage or low voltage cards of the constructions Shown at 12A and 12B in FIGS. 3 and 4. However, the actuator 80 will be operated only when the low voltage card 12B is inserted. The host of the present invention senses the card discriminating key portion 69B of the low voltage card by the fact that it operates the switch actuator 80.

FIG. 5 shows a switchable voltage-sensitive circuit 100 that is part of the electronic device 102 that contains the host 70 and the circuit 100. This circuit includes a high voltage source 104 and a low voltage source 106. For the particular circuit 100, a high voltage switch 110 is initially closed, while a low voltage switch 112 is initially open. If a high voltage card is inserted into the host, such high voltage card will not operate the switch 82 and the high voltage switch 110 will remain closed. When such high voltage card is fully inserted, a card-sensing contact 114 will sense the full insertion, and will operate an electronic relay indicated at 116 which will close two power switches 120, 122. Only closure of the high voltage power switch 120 will be significant, and upon its closure, current can flow from the high voltage supply 104 through the switches 120, 110, to a high voltage circuit 124 of the circuit assembly 100 (and to the card to energize it).

If a low voltage card of the type shown at 12B in FIG. 4, is inserted into the host 70 of FIG. 5, then the card discrimination key portion 69B of the card will operate the switch actuator 80 to close the card-sensing switch 82. Current passing through the switch 82 will operate an electronic relay 126 to change the states of both switches 110, 112. That is, the high voltage switch 110 will open while the low voltage switch 112 will close. Full insertion of the card is sensed by short contacts 114, 114A, which can connect to relay 116. When the card is fully inserted, as sensed by the card insertion contacts 114, 114A, so switch 122 is closed, current can flow from the low voltage source 106 through a low voltage circuit 130 (and to the card to energize it). Thus, the electronic device has separate circuits 124, 130 that each operate at a different voltage, and with a selected one of the circuits 124, 130 being energized depending upon whether the full insertion of a high voltage card is sensed (by engagement of contact 114 and by absence of operation of switch 82) or a low voltage card is sensed (by contact 114 and operation of switch 82).

Most of the pin contacts 18 such as pin 18A are connected to both circuits 124, 130, as indicated by line 132, so each circuit 124, 130 can receive and send data signals of appropriate voltage to and from the inserted card through the pin contacts. A pair of power pin contacts are connected so power from a selected voltage source 104, 106 can energize the card through the power pin contacts (e.g. pin contact 18X). The circuit assembly 100 includes a large processing circuit 140 that is designed to be energized by a low voltage (3 volts) and which has a corresponding low logic voltage. Interaction of the large circuit 140 with the low voltage circuit 130 is relatively straight forward. The high voltage circuit 124 preferably converts high voltage logic to low voltage logic signals which it transmits and receives to and from the large circuit 140. The large circuit 140 may consume considerable power, and its operation at a low voltage can generally result in a lower power consumption to achieve a longer battery life. The high voltage circuit 124 may contain a limited number of components so that it may consume only a limited amount of power. The high voltage source 104 therefore may be obtained from a high voltage battery of limited capacity, or by electronically boosting the output of the low voltage source 106, for a portable electronic device. Thus, even when a high voltage card is to be interfaced with, the circuit assembly 100 can take advantage of the lower power consumption of the low voltage large circuit 140.

Figure 7:
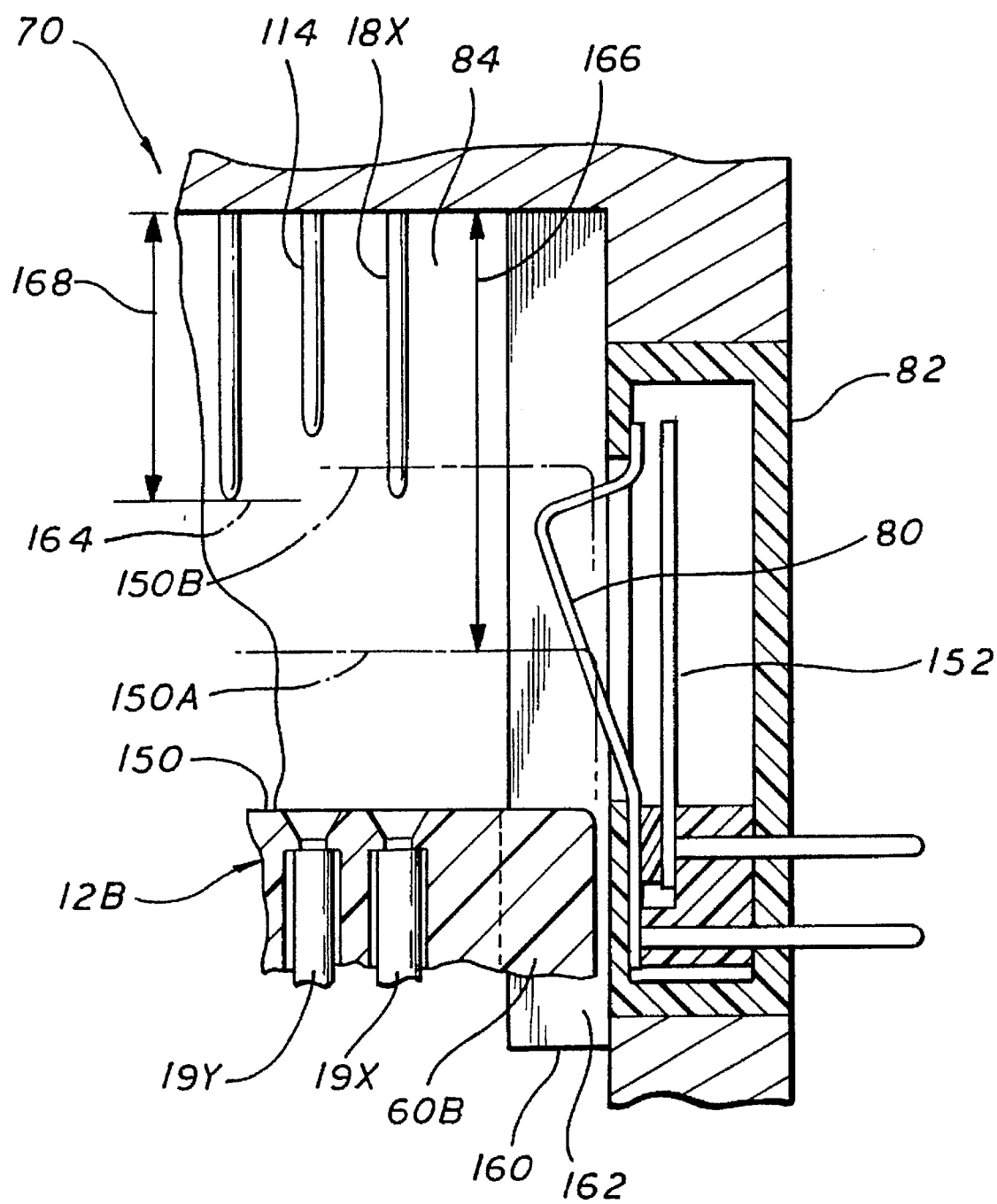
FIG. 7 is a view taken on line 7—7 of FIG. 6, showing some of the pin contacts, and including a sectional view of a partially inserted card.

FIG. 7 shows a low voltage card 12B in the course of its insertion into the host slot 84. At the position shown in solid lines at 12B in FIG. 7, the leading edge 150 of the card has passed an outwardly-facing shoulder 160 of a host orientation key barrier, but not yet encountered the switch actuator 80. When the leading edge reaches the position 150A, it will have encountered the actuator 80 and deflected it sufficiently for the actuator 80 to engage a switch contact 152, and thereby close the switch. When the leading edge of the card has reached the position 150B, a card socket contact 19X will first engage a host pin contact 18X. The card leading edge position 150B is slightly inward of contact line 164 which lies at the outer ends of the pins. After further inward movement of the card, a card contact 19Y will engage the card sensing contact 114 of the host. The distance 166 to the position 150A where the switch is actuated, is preferably between 5 mm (which is the distance 168) and 10 mm.

Although a mechanical actuator 80 is shown for use in sensing the presence of a low voltage card to operate a switch, it is also possible to use other switching devices such as a proximity switch to sense the presence of the card discriminating key portion 69 to operate a switch.

Although terms such as "top", "bottom", etc., have been used herein to describe the prior art and the present invention as illustrated, it should be understood that it is possible for the host and card to be used in any orientation with respect to Earth's gravity.

Thus, the invention provides an IC card receiving host, and an electronic device that includes such host, which enables a single host to receive and effectively operate on both high voltage (e.g. 5 volts nominal) and low voltage (e.g. 3 volts nominal) cards. The host has a switch with an actuator which senses a key portion that is normally occupied by a card discrimination key portion of one type of card such as the low voltage card, but not the other card such as the high voltage card. Thus, the presence of only one type of card operates the switch. The electronic device can include both high and low voltage circuits, with only a selected one of them being energized and capable of interacting with an installed card, depending on whether the switch is operated or not.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card-receiving host for connecting a received IC card to an electronic device that has circuitry which can be switched to operate at first or second voltages, wherein said host has a card-receiving slot with first and second sides, wherein said slot can receive first and second IC cards where said first card is designed to operate at said first voltage and said second card is designed to operate at said second voltage, and wherein said cards have differently keyed first sides (52A and 52B) that each indicates the designed voltage for that card, said keyed first sides of said cards constructed so they both have corresponding discrimination locations and said second card has a discrimination key portion (66B) lying at its discriminating location but said first card does not have a key portion at its discrimination location, characterized by:

a switch (82) located at said card host first side, said switch having an actuator (80) positioned to be operated by said discrimination key portion (66B) of said second card and to not be operated by said first card, and said switch being connected to said circuitry which can be switched.

2. The host described in claim 1 wherein:

said slot has an inner end portion, said host has contacts at said inner end portion, and said slot has a slot top and a slot bottom;

said first side of said slot inner end portion has top, bottom, and middle regions lying between said slot top and said slot bottom, with said bottom region having a barrier to the inward passage of any IC card portion thereat, and with said top and middle regions being devoid of a barrier but with said switch actuator lying in said middle region.

3. The host described in claim 1 wherein:

said host slot has an open outer end and a primarily closed inner end, and said host has at least one laterally-extending row of pin contacts lying at said slot inner end between said first side and a laterally opposite second side, said pin contacts extending in an outward direction from said slot inner end, with said pins having outer ends extending no further outward from said slot inner end than a predetermined imaginary laterally extending contact line;

said host has a barrier at said first side, which has an outwardly-facing barrier shoulder lying at a shoulder portion which is outward of said contact line;

said actuator has a card engaging part that lies in said slot at a position that is outward of said contact line but inward of said barrier shoulder.

4. An electronic device which has a switchable voltage sensitive circuit and a card host for receiving IC cards that operate at different voltages, wherein:

said host has a slot with an open outer end and an inner end, said slot inner end having laterally-spaced first and second sides and having a top and bottom, said host having a laterally-extending row of pin contacts extending outwardly from said inner end with said pins having pin outer ends, and said host having an orientation key barrier near the bottom of said slot first side with said barrier having an outer shoulder spaced a plurality of millimeters outward of the outer ends of substantially all of said pin contacts;

said host includes a switch coupled to said voltage sensitive circuit and to said host, said switch having an actuator which is positioned to sense the presence of a card portion lying at said first side of said slot inner end, at a predetermined location above said orientation key barrier.

5. An electronic device that can receive low and high voltage IC cards that are each constructed in accordance with PCMCIA standards with keys that permit a high voltage card to be received in a low voltage host but that prevent a low voltage card from being received in a high voltage host, comprising:

a low voltage source for energizing a low voltage IC card, and a higher voltage source for energizing a high voltage IC card;

a card-receiving host which has a card-receiving slot and at least one laterally-extending row of pin contacts;

a switching device which is operable to connect a selected one of said voltage sources to at least one of said pin contacts to energize an IC card lying in said slot, and a sensor which selectively senses keys of cards to sense the presence of a low voltage IC card and a high voltage card and which operates said switching device only when it senses a selected one of said cards.

6. The electronic device described in claim 5, wherein:

said host slot has an inner end portion with laterally spaced first and second sides, with a top and a bottom, and with upper, lower and middle regions that are each of a height of more than one sixth the distance between said top and said bottom;

said pins project outwardly from said inner end of said slot, and said sensor senses the presence or absence of a card portion in said middle region of said first side of said slot, to switch said switching device to connect said at least one pin respectively to said low voltage circuit and to said high voltage circuit.

7. A method for operating a low voltage electronic device with a host that has a card-receiving slot, to receive and energize low or high voltage cards, wherein each of said cards has a front end with at least one laterally-extending row of contacts, with the front end of each card having a laterally extending width with opposite sides and a thickness which is less than half said width, where low voltage cards have card discriminating key portions at a middle location lying at a first of said sides but high voltage cards do not have key portions at said middle location, comprising:

constructing said electronic device so it can operate said low voltage card and can be switched to operate said high voltage card;

sensing the installation in said slot of a high voltage card, including the detection of a card discriminating key-portion at said middle location, and switching said electronic device to operate said high voltage card upon said sensing.

* * * * *